(12) United States Patent
Han et al.

(10) Patent No.: US 12,034,032 B2
(45) Date of Patent: *Jul. 9, 2024

(54) MICRO LED DEVICE AND METHOD OF MANUFACTURING THE SAME

(71) Applicant: SAMSUNG ELECTRONICS CO., LTD., Suwon-si (KR)

(72) Inventors: Joohun Han, Hwaseong-si (KR); Junhee Choi, Seongnam-si (KR); Kiho Kong, Suwon-si (KR); Jinjoo Park, Yongin-si (KR); Nakhyun Kim, Yongin-si (KR); Junghun Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/308,895

(22) Filed: Apr. 28, 2023

(65) Prior Publication Data
US 2023/0317768 A1    Oct. 5, 2023

Related U.S. Application Data

(63) Continuation of application No. 16/922,147, filed on Jul. 7, 2020, now Pat. No. 11,670,667.

(30) Foreign Application Priority Data

Oct. 22, 2019    (KR) .................. 10-2019-0131387

(51) Int. Cl.
*H01L 33/00* (2010.01)
*H01L 27/15* (2006.01)

(52) U.S. Cl.
CPC ........ *H01L 27/156* (2013.01); *H01L 33/0093* (2020.05); *H01L 33/0095* (2013.01); *H01L 33/007* (2013.01)

(58) Field of Classification Search
None
See application file for complete search history.

(56) References Cited

U.S. PATENT DOCUMENTS 11,670,667 B2 * 6/2023 Han ............... H01L 25/0753
257/66
2017/0301724 A1 10/2017 Lee
(Continued)

FOREIGN PATENT DOCUMENTS

| CN | 109496368 A | 3/2019 |
|----|-------------|--------|
| KR | 10-2018-0119273 A | 11/2018 |
| KR | 10-2019-0006430 A | 1/2019 |

OTHER PUBLICATIONS

Nominanda et al., "The p-channel a-Si:H Thin Film Transistor with Plasma Etched Copper Electrodes," Materials Research Society, Mat. Res. Soc. Symp. Proc. vol. 808, 2004, total 6 pages.

*Primary Examiner* — Bradley Smith
(74) *Attorney, Agent, or Firm* — Sughrue Mion, PLLC

(57) ABSTRACT

A micro light emitting diode (LED) device and a method of manufacturing the same are provided. A micro LED device includes a light emitting layer that is provided on a support substrate, a bonding layer, and a driver layer. The light emitting layer includes a stacked structure including a first semiconductor layer, an active layer, and a second semiconductor layer; first and second electrodes provided on a first side and a second side of the stacked structure; and a plurality of light emitting regions. The bonding layer is positioned between the support substrate and the light emitting layer. The drive layer includes a drive element electrically connected to the light emitting layer and is positioned on the light emitting layer to apply power to the plurality of light emitting regions of the light emitting layer.

20 Claims, 17 Drawing Sheets

(56) References Cited

U.S. PATENT DOCUMENTS

| | | |
|---|---|---|
| 2018/0182831 A1 | 6/2018 | Ahmed et al. |
| 2018/0190712 A1 | 7/2018 | Xu et al. |
| 2018/0261736 A1 | 9/2018 | Bonar et al. |
| 2019/0043916 A1 | 2/2019 | Shin et al. |
| 2019/0252312 A1 | 8/2019 | Yu et al. |
| 2019/0333897 A1 | 10/2019 | Chen |

* cited by examiner

MICRO LED DEVICE AND METHOD OF
MANUFACTURING THE SAME

CROSS-REFERENCE TO RELATED APPLICATION

This application is a continuation of U.S. application Ser. No. 16/922,147, filed Jul. 7, 2020, which claims priority from Korean Patent Application No. 10-2019-0131387, filed on Oct. 22, 2019, in the Korean Intellectual Property Office, the disclosure of which is herein incorporated by reference in its entirety.

BACKGROUND

1. Field

Example embodiments relate to a micro light emitting diode (LED) device and a method of manufacturing the same.

2. Description of Related Art

A liquid crystal display (LCD), an organic light emitting diode (OLED) display, and the like are widely used as a display device. Recently, a technology for manufacturing a high-resolution micro light emitting diode (LED) display by using a micro LED has received much attention. The LED has advantages of low power consumption and environmental friendliness. Thus, there is a high industrial demand for the LED.

It is necessary for a large-area substrate to be used as an epitaxial substrate for improving process yield when epitaxy of a Group III-V GaN-based micro LED is performed to manufacture a micro LED display. In addition, since the process is not easily performed due to a thickness, a weight, etc. of the large-area substrate when using the large-area substrate, an LED process is performed after a thickness of an epitaxial substrate is reduced to approximately half through a thin wafer process.

When the thickness of the epitaxial substrate is reduced to approximately half so as to be advantageous in a fabrication process, compressive and tensile stress may greatly increase during a thin film process, a breakage of the epitaxial substrate may occur due to a damage that occurs during a handling process of the fabrication process, and/or due to a strain during deposition and etching processes of an LED process.

Accordingly, there is a need for a method of manufacturing a micro LED device that is robust to a breakage and may be highly efficient.

SUMMARY

One or more example embodiments provide a micro light emitting diode (LED) device and a method of manufacturing the same which are robust to a breakage and highly efficient.

Additional aspects will be set forth in part in the description which follows and, in part, will be apparent from the description, or may be learned by practice of the presented embodiments of the disclosure.

According to an aspect of an example embodiment, provided is a micro light emitting diode (LED) device, including: a support substrate; a light emitting layer provided on the support substrate, the light emitting layer including: a stacked structure including a first semiconductor layer, an active layer, and a second semiconductor layer; a first electrode and a second electrode provided on a first side and a second side of the stacked structure, respectively; and a plurality of light emitting regions; a bonding layer between the support substrate and the light emitting layer; and a drive layer provided on the light emitting layer and including a drive element, the drive element being electrically connected to the light emitting layer and configured to apply power to the plurality of light emitting regions of the light emitting layer.

The light emitting layer may further include an isolation structure that separates the plurality of light emitting regions from each other.

The drive element of the drive layer may include a thin film transistor configured to apply the power to the plurality of light emitting regions.

The drive element may include an n-MOS low-temperature polycrystalline silicon (LPTS) thin film transistor.

The micro LED device may include a current blocking layer in a region corresponding to the isolation structure on the light emitting layer.

The micro LED device may include: a color conversion layer including a plurality of color conversion regions for converting a light emitted from the light emitting layer into light colors.

The color conversion layer may include a partition wall provided between the plurality of color conversion regions.

The first electrode may be provided between the bonding layer and the first semiconductor layer; the second electrode may be a pixel electrode and provided between the second semiconductor layer and the drive layer; and each of the plurality of light emitting regions may correspond to a pixel, and a unit pixel may include two or more light emitting regions.

The unit pixel may include a first light emitting region, a second light emitting region, and a third light emitting region of the light emitting layer, and the plurality of color conversion regions may include: a first color conversion region for converting a light generated in the first light emitting region into a first color light; a second color conversion region for converting a light generated in the second light emitting region into a second color light; and a third color conversion region for converting a light generated in the third light emitting region into a third color light.

The unit pixel may include a first light emitting region, a second light emitting region, and a third light emitting region of the light emitting layer, and the plurality of color conversion regions may include: a first color conversion region for converting a light generated in the first light emitting region into a first color light; a second color conversion region for converting a light generated in the second light emitting region into a second color light; and a transparent region via which a light generated in the third light emitting region passes without color conversion.

According to an aspect of an example embodiment, provided is a method of manufacturing a micro light emitting diode (LED) device, the method including: forming a stacked structure including a first semiconductor layer, an active layer, and a second semiconductor layer of a light emitting layer on a growth substrate in an order of the second semiconductor layer, the active layer, and the first semiconductor layer; forming an isolation structure in the stacked structure to form a plurality of light emitting regions in the light emitting layer; forming a first electrode on the stacked structure; bonding a support substrate to the growth substrate, the support substrate facing the first electrode; removing the growth substrate and performing etching to remove a part of a thickness of the second semiconductor layer and expose an end portion of the isolation structure; forming a second electrode electrically connected to the stacked structure and configured to generate a light in the plurality of light emitting regions; and forming a drive layer including a drive element, the drive element being electrically connected to the second electrode on the light emitting layer and configured to apply power to the plurality of light emitting regions.

The method of manufacturing the micro LED device may further include, prior to forming the second electrode, forming a current blocking layer on a region corresponding to the isolation structure, and the second electrode may be electrically connected to an upper surface of the stacked structure on which the current blocking layer is formed, corresponding to each light emitting region.

The isolation structure may be formed to a partial thickness of the second semiconductor layer, and the etching may be performed until at least the end portion of the isolation structure is exposed by removing the partial thickness of the second semiconductor layer.

The isolation structure may be formed by injecting ions.

The method of manufacturing the micro LED device may further include: forming a color conversion layer on the drive layer, the color conversion layer including a plurality of color conversion regions for converting a light emitted from the light emitting layer into light colors.

The color conversion layer may be formed to further include a partition wall between the plurality of color conversion regions.

The first electrode may be a common electrode, and the second electrode may be a pixel electrode; each of the plurality of light emitting regions may correspond to a pixel; and a unit pixel may include two or more light emitting regions.

The unit pixel may include a first light emitting region, a second light emitting region, and a third light emitting region of the light emitting layer, and the plurality of color conversion regions may include: a first color conversion region for converting a light generated in the first light emitting region into a first color light; a second color conversion region for converting a light generated in the second light emitting region into a second color light; and a third color conversion region for converting a light generated in the third light emitting region into a third color light.

The unit pixel may include a first light emitting region, a second light emitting region, and a third light emitting region of the light emitting layer, and the plurality of color conversion regions may include: a first color conversion region for converting a light generated in the first light emitting region into a first color light; a second color conversion region for converting a light generated in the second light emitting region into a second color light; and a transparent region via which a light generated in the third light emitting region pass without color conversion.

The drive element of the drive layer may include an n-MOS low-temperature polycrystalline silicon (LPTS) thin film transistor configured to apply the power to the plurality of light emitting regions.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
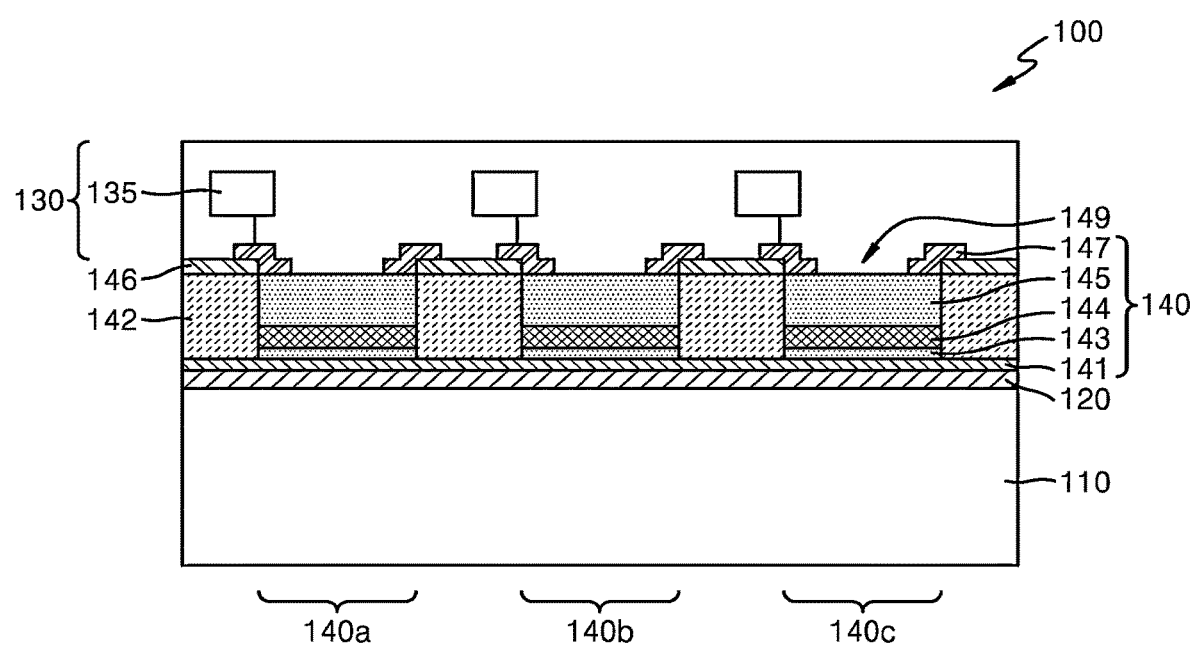
FIGS. 1 and 2 schematically illustrate a micro light emitting diode (LED) device according to example embodiments.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described in detail with reference to the accompanying drawings. In the drawings, like reference numerals refer to like elements, and a size of each element in the drawings may be exaggerated for clarity and convenience of description. Example embodiments to be described below are merely examples, and various modifications are possible from example embodiments.

Hereinafter, what is described as "over" or "on" may include not only directly over and in contact but also over without being in contact. The terms first, second, and the like may be used to describe various configuration elements, but are only used to distinguish one configuration element from another configuration element. These terms do not limit the materials or structures of the configuration elements. A singular expression includes plural expressions unless the context clearly indicates otherwise. In addition, when a part is described to "include" a certain configuration element, which means that the part may further include other configuration elements, except to exclude other configuration elements unless otherwise stated. A term "above-described" and similar terminology may be used for the singular and the plural.

Figure 2:
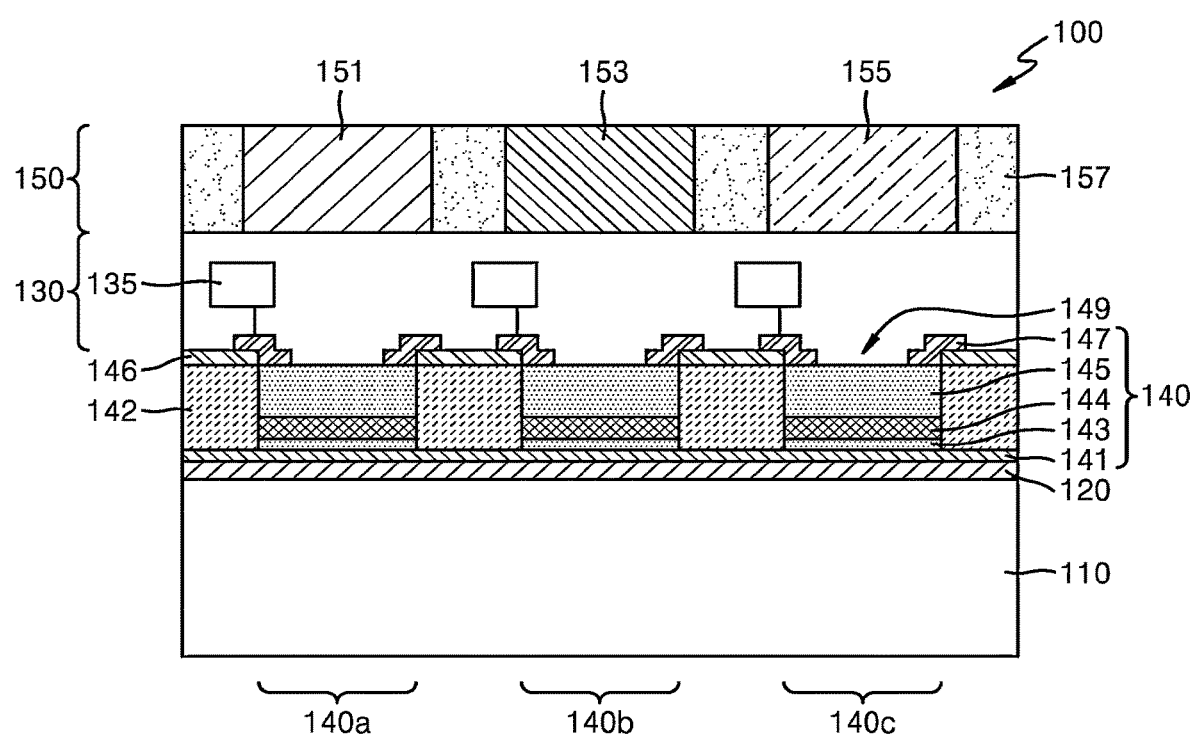

FIGS. 1 and 2 schematically illustrate a micro light emitting diode (LED) device 100 according to example embodiments. The micro LED device 100 of FIG. 2 further includes a color conversion layer 150 as compared with FIG. 1.

Referring to FIGS. 1 and 2, the micro LED device 100 may include a support substrate 110, a light emitting layer 140 on the support substrate 110, and a drive layer 130 provided on the light emitting layer 140. A bonding layer 120 may be formed between the support substrate 110 and the light emitting layer 140. The color conversion layer 150 may be further provided on the drive layer 130 to implement a color. Here, the micro LED device 100 may be additionally or alternatively provided with a color filter separately for implementing the color, instead of the color conversion layer 150.

The support substrate 110 may be a separate substrate from a growth substrate, for example, an epitaxial substrate, in which a stacked structure of the light emitting layer 140 is formed through a semiconductor deposition process. The support substrate 110 may not be the growth substrate. For example, a silicon substrate, a glass substrate, a sapphire substrate, a silicon substrate coated with $SiO_2$, or the like may be used as the support substrate 110. However, these substrates are merely examples, and various other materials may be used as the support substrate 110.

The bonding layer 120 may be formed between the support substrate 110 and the light emitting layer 140. The bonding layer 120 may be a layer formed by bonding the light emitting layer 140 to the support substrate 110 and may be a layer formed through, for example, adhesive bonding, eutectic bonding, or direct bonding. For example, an epoxy resin or a resin such as a silicone group, benzocyclobutene (BCB), a polysilazane group, or a siloxane group may be used for the adhesive bonding. In addition, the adhesive bonding may be performed by using a spin on glass (SOG) method. The eutectic bonding may use a metal. The direct bonding may be performed by, for example, plasma, ion beam processing, etc. The bonding layer 120 may be used to physically bond the light emitting layer 140 to the support substrate 110, and thus, the light emitting layer 140 may be bonded to the support substrate 110 by using a bonding method without an electrical connection.

The light emitting layer 140 may include a stacked structure of a first semiconductor layer 143, an active layer 144 located on the first semiconductor layer 143, and a second semiconductor layer 145 located on the active layer 144. The light emitting layer 140 may include a first electrode 141 below the first semiconductor layer 143, and a second electrode 147 over the second semiconductor layer 145. In addition, the light emitting layer 140 may further include an isolation structure 142 to form a plurality of light emitting regions in the stacked structure. By including the isolation structure 142 for isolating the light emitting regions from each other to form the plurality of light emitting regions as described above, a micro LED array may be formed. When the isolation structure 142 is formed such that each light emitting region corresponds to a pixel, the micro LED device 100 according to an example embodiment may be implemented as a micro LED display.

In the light emitting layer 140, the first semiconductor layer 143 may include a first type semiconductor. For example, the first semiconductor layer 143 may include a p-type semiconductor. The first semiconductor layer 143 may include a Group III-V-based p-type semiconductor such as p-GaN. The first semiconductor layer 143 may have a single layer structure or a multilayer structure.

The active layer 144 may generate light while electrons and holes are combined. The active layer 144 may have a multi-quantum well (MQW) structure or a single-quantum well (SQW) structure. The active layer 144 may include a Group III-V-based semiconductor such as GaN.

The second semiconductor layer 145 may include, for example, an undoped semiconductor, that is, a u-type semiconductor or an n-type doped semiconductor, that is, an n-type semiconductor. The second semiconductor layer 145 may include a Group III-V-based u-type semiconductor such as u-GaN or an n-type semiconductor such as n-GaN. The second semiconductor layer 145 may have a single layer structure or a multilayer structure.

The stacked structure of the first semiconductor layer 143, the active layer 144, and the second semiconductor layer 145 of the light emitting layer 140 may be grown through, for example, a GaN-based semiconductor deposition process.

As described above, the light emitting layer 140 may have the isolation structure 142 such that light from the active layer 144 is emitted in a unit of each light emitting region. That is, the light emitting layer 140 may have the isolation structure 142 between adjacent light emitting regions. When the micro LED device 100 according to an example embodiment is implemented as a micro LED display, the light emitting regions may respectively correspond to pixels.

For example, the light emitting layer 140 may have the isolation structure 142 such that light from the active layer 144 is emitted in units of pixels. A unit pixel may include two or more light emitting regions to enable color implementation. When each light emitting region corresponds to a pixel, the unit pixel may include, for example, three pixels or four pixels to enable the color implementation.

The isolation structure 142 may be, for example, an ion injection region. Here, ions may include, for example, nitrogen (N) ions, boron (B) ions, argon (Ar) ions, or phosphorus (P) ions. Since no current flows into the ion injection region, light may not emit therefrom. When the isolation structure 142 is formed as the ion injection region, a micro LED array structure may be implemented without an etching process of the light emitting layer 140 for the isolation structure 142.

The first electrode 141 and the second electrode 147 may be provided at both sides of the stacked structure of the light emitting layer 140. The first electrode 141 may be located between the bonding layer 120 and the first semiconductor layer 143 and may be formed to be electrically connected to, for example, the first semiconductor layer 143. The second electrode 147 may be located between the second semiconductor layer 145 and the drive layer 130 and may be formed to be electrically connected to, for example, the second semiconductor layer 145. The first electrode 141 may be a common electrode, and the second electrode 147 may be a pixel electrode. When the first semiconductor layer 143 includes a p-type semiconductor, the first electrode 141 may be a common electrode and a p-type electrode. That is, the first electrode 141 may be a p-type common electrode. The second electrode 147 may be, for example, an n-type electrode.

The first electrode 141 may include a reflective material to reflect light, emitted from the active layer 144 toward a lower portion of the active layer 144. The first electrode 141 may be formed of an electrode material including, for example, Ag, Au, Al, Cr, Ni, Ti, an alloy thereof, etc. and may be formed to have a single-layer structure or a multilayer structure. For example, the first electrode 141 may have a multilayer structure of Ti/Al/Ti.

The second electrode 147 may be formed as a transparent electrode or an opaque electrode. The transparent electrode may include, for example, indium tin oxide (ITO), ZnO, indium zinc oxide (IZO), IGZO, etc. When the second electrode 147 is formed as a transparent electrode, the second electrode 147 may be disposed to entirely cover the second semiconductor layer 145. When the second electrode 147 is an opaque electrode, the second electrode 147 may further include a window region 149 to transmit light emitted from the active layer 144. For example, the second electrode 147 may be formed of an electrode material including Mo to have the window region 149.

A current blocking layer 146 may be further provided in a region corresponding to the isolation structure 142. When the current blocking layer 146 is provided, the second electrode 147 may be formed on the current blocking layer 146 to extend over a top surface of the second semiconductor layer 145.

The drive layer 130 may include a drive element 135 electrically connected to the light emitting layer 140 to apply power to each of the plurality of light emitting regions of the light emitting layer 140. The drive element 135 may be electrically connected to the second electrode 147. The drive element 135 may include a thin film transistor to apply power to each of the plurality of light emitting regions. For example, the drive element 135 may include an n-MOS low-temperature polycrystalline silicon (LPTS) thin film transistor. In addition, various types of thin film transistors, for example, a high electron mobility transistor (HEMT), etc. may be used as the drive element 135.

Referring to FIG. 2, the color conversion layer 150 provided on or over the drive layer 130 may include a plurality of color conversion regions 151, 153, and 155 for converting light emitted from the active layer 144 into light colors. Based on the color conversion layer 150 including the plurality of color conversion regions 151, 153, and 155, the micro LED device 100 according to an example embodiment may implement a color micro LED display.

For example, the color conversion regions of the color conversion layer 150 may respectively correspond to the light emitting regions of the light emitting layer 140. When each of the light emitting regions of the light emitting layer 140 corresponds to a pixel, and a unit pixel includes two or more light emitting regions and two or more color conversion regions corresponding, one to one, to the light emitting regions and converting light to different color each other such that a unit pixel enables color to be implemented, the micro LED device 100 according to an example embodiment may be implemented as a color micro LED display.

FIG. 2 illustrates an example case where a unit pixel includes a first light emitting region 140a, a second light emitting region 140b, and a third light emitting region 140c of the light emitting layer 140, and the first color conversion region 151, the second color conversion region 153, and the third color conversion region 155 of the color conversion layer 150 correspond, one to one, to the first to the third light emitting regions 140a, 140b, and 140c. The first color conversion region 151 may convert the light generated in the first light emitting region 140a into first color light. The second color conversion region 153 may convert the light generated in the second light emitting region 140b into second color light. The third color conversion region 155 may convert the light generated in the third light emitting region 140c into third color light.

For example, the active layer 144 of the light emitting layer 140 may emit blue light. In this case, the first to the third light emitting regions 140a, 140b, and 140c may generate blue light, and the first to the third color conversion regions 151, 153, and 155 may convert the incident blue light into the first to the third color light. For example, the color conversion layer 150 may include a red conversion region, a green conversion region, and a blue conversion region as the first to the third color conversion regions 151, 153, and 155, respectively. The red conversion region corresponds to a red pixel, the green conversion region corresponds to a green pixel, and the blue conversion region corresponds to a blue pixel. In an example embodiment, when the active layer 144 emits blue light, instead of providing a blue conversion region as the third color conversion region 155, a transparent region that makes the light generated in the third light emitting region 140c pass therethrough without color conversion may be provided.

The first color conversion region 151, for example, the red conversion region, may convert blue light emitted from the active layer 144 into red light and emit the red light. The red conversion region may include, for example, quantum dots (QDs) of a predetermined size that are excited by blue light to emit red light. Also, the red conversion region may include a phosphor which is excited by blue light B emitted from the active layer 144 to emit red light. The red conversion region may further include a photoresist or a light scattering agent.

The second color conversion region 153, for example, the green conversion region, may convert light emitted from the active layer 144 into green light and emit the green light. The green conversion region may include, for example, QDs of a predetermined size that are excited by blue light to emit green light. Also, the green conversion region may include a phosphor that is excited by light emitted from the active layer 144 to emit green light. The green conversion region may further include a photoresist having good transmission characteristics or a light scattering agent that uniformly emits green light.

In the red conversion region and the green conversion region, the QDs may have a core-shell structure including a core portion and a shell portion or may have a particle structure without a shell. The core-shell structure may have a single shell or multi-shells. The multi-shells may be, for example, double-shells. The QD may include, for example, at least one of a Group II-VI-based semiconductor, a Group III-V-based semiconductor, a Group IV-based semiconductor, and graphene QDs. As an example, the QD may include at least one of Cd, Se, Zn, S, and InP, and is not limited thereto. Each QD may have a diameter less than or equal to several tens of nm, for example, a diameter less than or equal to approximately 10 nm.

The third color conversion region 155 may be a transparent region via which blue light emitted from the active layer 144 pass and is emitted to the outside. In an example embodiment, when the blue light is emitted from the active layer 144, the third color conversion region 155 may be provided as a blue conversion region, and the blue conversion region may include QDs of a predetermined size that are excited by, for example, the blue light to emit the blue light having a changed spectral bandwidth. In the blue conversion region, the QD may have a core-shell structure including a core portion and a shell portion or may have a particle structure without a shell. The core-shell structure may have a single shell or multi-shells. The third color conversion region 155 may further include a photoresist having good transmission characteristics or a light scattering agent that uniformly emits the blue light.

FIG. 2 illustrates a case where a unit pixel includes three pixels, that is, one red pixel, one green pixel, and one blue pixel, which is merely an example and the example embodiments of the disclosure are not limited thereto. For example, the micro LED device 100 according to an example embodiment implemented as a color micro LED display may include four pixels, for example, one red pixel, two green pixels, and one blue pixel. In this case, the color pixels may be arranged in, for example, a Bayer pattern.

In addition, the light emitted from the active layer 144 is not limited to blue light and may be light having a different wavelength as long as the light may excite the first to the third color conversion regions 151, 153, and 155, and the first to the third color conversion regions 151, 153, and 155 of the color conversion layer 150 may be provided to convert incident light into red light, green light, and blue light, according to a wavelength of the light generated in the active layer 144.

The color conversion layer 150 may further include a partition wall 157 between the color conversion regions. A side surface of the partition wall 157 may be formed as a reflective surface or may be configured by a black matrix for absorbing light. The black matrix may improve contrast by preventing color crosstalk from occurring between color conversion regions.

In the above-described structure, for example, if the drive element 135 corresponding to a red pixel is driven to apply a predetermined voltage between the first electrode 141 and the second electrode 147 corresponding to the red pixel, blue light is emitted from the active layer 144 of the first light emitting region 140a located below the red color conversion region, that is, the first color conversion region 151, and the blue light emitted is converted into red light in the red conversion region to be emitted to the outside.

In addition, for example, if the drive element 135 corresponding to a green pixel is driven and a predetermined voltage is applied between the first electrode 141, which is a common electrode, and the second electrode 147 corresponding to the green pixel, the blue light is emitted from the active layer 144 of the second light emitting region 140b located below the green conversion region 152, that is, the second color conversion region 153, and the emitted blue light is incident on the green conversion region to be converted into green light and emitted to the outside.

In addition, for example, if the drive element 135 corresponding to a blue pixel is driven to apply a predetermined voltage between the first electrode 141, which is the common electrode, and the second electrode 147 corresponding to the blue pixel, for example, blue light is emitted from the active layer 144 located below the blue conversion region, that is, the third color conversion region 155, and the blue light passing through the blue color conversion region is emitted to the outside.

Figure 3:
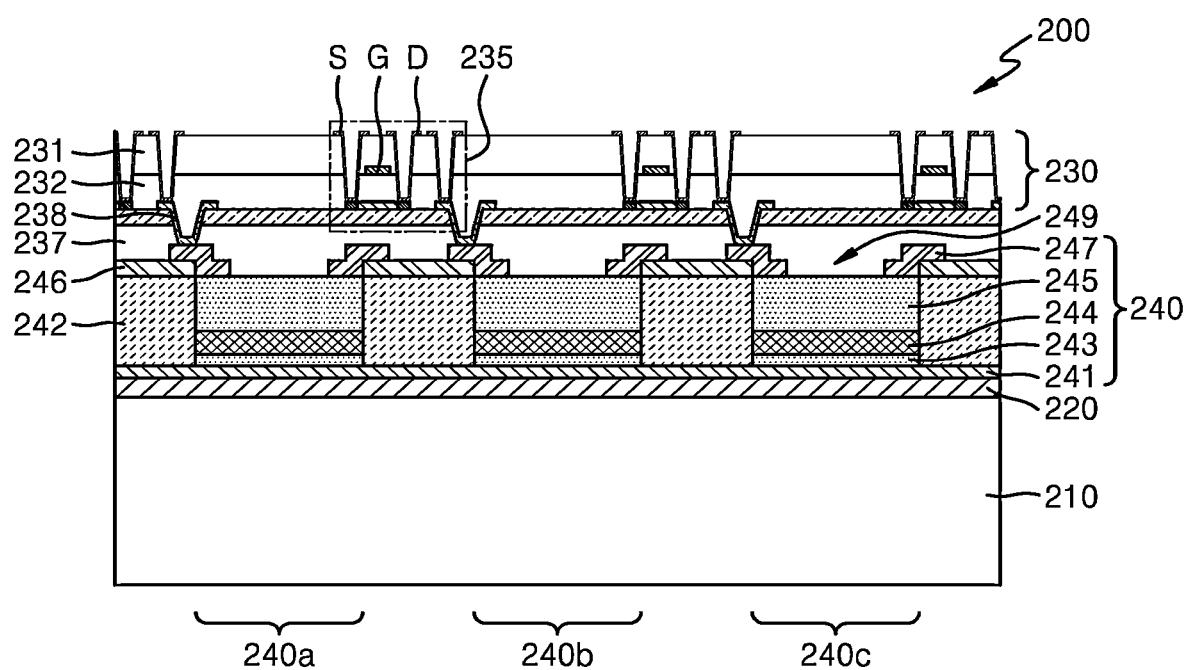
FIGS. 3 and 4 are cross-sectional views schematically illustrating micro LED devices according to other example embodiments.
Figure 4:
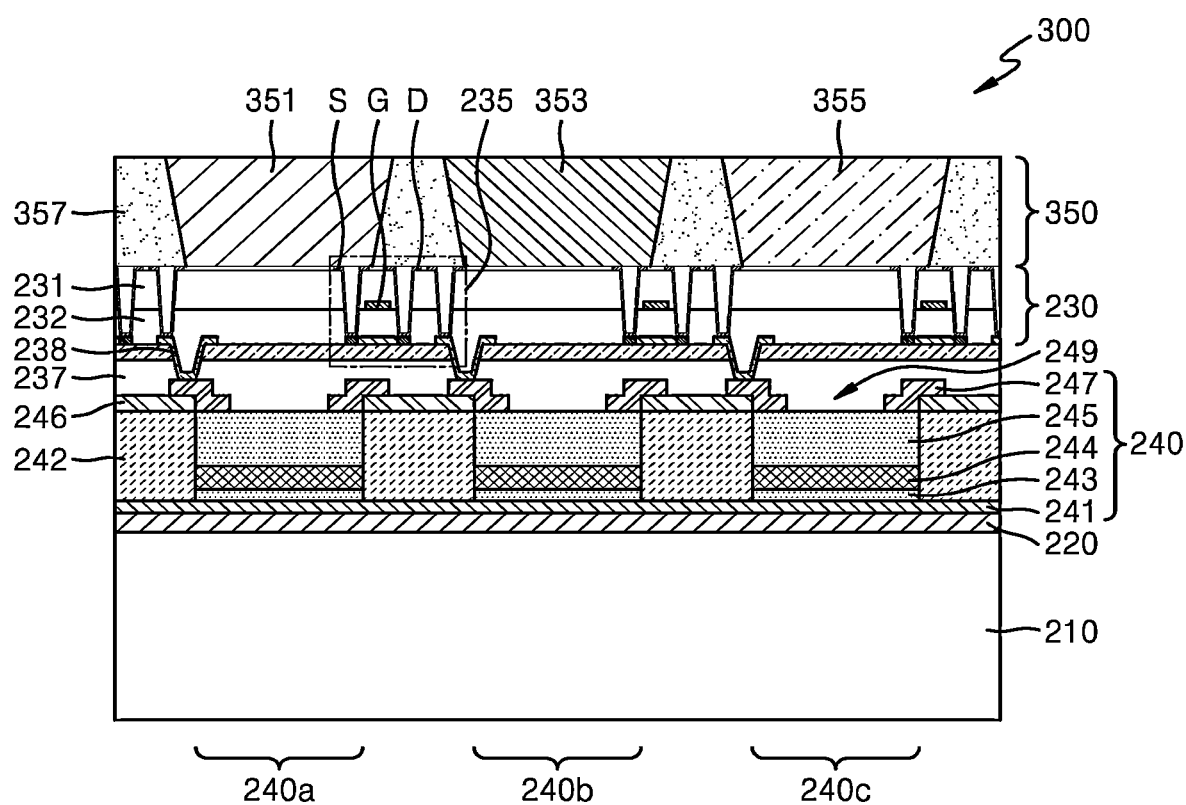

FIGS. 3 and 4 are cross-sectional views schematically illustrating micro LED devices 200 and 300 according to other example embodiments. The micro LED device 300 of FIG. 4 further includes a color conversion layer 350 as compared with the micro LED device 200 of FIG. 3.

Referring to FIGS. 3 and 4, the micro LED devices 200 and 300 may include a support substrate 210, a light emitting layer 240 on the support substrate 210, and a drive layer 230 provided on the light emitting layer 240. A bonding layer 220 may be formed between the support substrate 210 and the light emitting layer 240. In addition, the color conversion layer 350 may be further provided on the drive layer 230 as illustrated in FIG. 4.

The support substrate 210 may be a substrate separate from a growth substrate, for example, an epitaxial substrate, in which the light emitting layer 240 and the drive layer 230 are formed through a semiconductor deposition process, etc. That is, the support substrate 210 may not be the growth substrate. For example, a silicon substrate, a glass substrate, a sapphire substrate, a silicon substrate coated with $SiO_2$, or the like may be used as the support substrate 210. However, these substrates are merely examples and various other materials may be used for the support substrate 210.

The bonding layer 220 may be formed between the support substrate 210 and the light emitting layer 240. The bonding layer 220 may be a layer formed by bonding the light emitting layer 240 to the support substrate 210 and may be a layer formed through, for example, adhesive bonding, eutectic bonding, or direct bonding. For example, an epoxy resin or a resin such as a silicone group, benzocyclobutene (BCB), a polysilazane group or Siloxane may be used for the adhesive bonding. In addition, the adhesive bonding may be performed by using a SOG method. The eutectic bonding may use a metal. The direct bonding may be performed by, for example, plasma, ion beam processing, etc. The bonding layer 220 is for physically bonding the light emitting layer 240 to the support substrate 210 and may bond the light emitting layer 240 to the support substrate 210 by using a bonding method that does not require an electrical connection.

The light emitting layer 240 may include a stacked structure of a first semiconductor layer 243, an active layer 244 located on the first semiconductor layer 243, and a second semiconductor layer 245 located on the active layer 244. In addition, the light emitting layer 240 may further include an isolation structure 242 to form a plurality of light emitting regions 240a, 240b, and 240c within the stacked structure. By providing the isolation structure 242 that separates the light emitting regions from each other to form the plurality of light emitting regions 240a, 240b, and 240c, a micro LED array may be formed. When the isolation structure 242 is formed such that each light emitting region corresponds to a pixel, the micro LED devices 200 and 300 according to an example embodiment may be implemented as micro LED displays.

In the light emitting layer 240, the first semiconductor layer 243 may include a first type semiconductor. For example, the first semiconductor layer 243 may include a p-type semiconductor. The first semiconductor layer 243 may include a Group III-V-based p-type semiconductor such as p-GaN. The first semiconductor layer 243 may have a single layer structure or a multilayer structure.

The active layer 244 may generate light while combining electrons and holes. The active layer 244 may have an MQW structure or an SQW structure. The active layer 244 may include a Group III-V-based semiconductor such as GaN.

The second semiconductor layer 245 may include, for example, an undoped semiconductor, that is, a u-type semiconductor or an n-type doped semiconductor, that is, an n-type semiconductor. The second semiconductor layer 245 may include a Group III-V-based u-type semiconductor such as u-GaN or an n-type semiconductor such as n-GaN. The second semiconductor layer 245 may have a single layer structure or a multilayer structure. For example, a fine pattern structure (not illustrated) or the like may be further provided at a location close to the drive layer 230 of the second semiconductor layer 245 to increase efficiency of light generated in the active layer 244 and extracted through the second semiconductor layer 245.

As described above, the light emitting layer 240 may have the isolation structure 242 such that light from the active layer 244 is emitted in units of the light emitting regions 240a, 240b, and 240c. That is, the light emitting layer 240 may have the isolation structure 242 between adjacent light emitting regions. When the micro LED devices 200 and 300 according to example embodiments are implemented as micro LED displays, the light emitting regions 240a, 240b, and 240c may respectively correspond to pixels.

For example, the light emitting layer 240 may have the isolation structure 242 such that the light from the active layer 244 is emitted in units of pixels. Each of the light emitting regions 140a, 140b, and 140c may correspond to the pixel.

In this case, the unit pixel may include a single light emitting region or may include two or more light emitting regions to enable color implementation.

When the color conversion layer 350 is not provided as illustrated in FIG. 3, the unit pixel may include a single light emitting region or a plurality of light emitting regions. The color may be implemented by generating light of different colors from at least three light emitting regions among the plurality of light emitting regions belonging to the unit pixel, or by additionally disposing a color filter separately from the micro LED device 200.

When the color conversion layer 350 is further included as illustrated in FIG. 4, the unit pixel may include, for example, three pixels or four pixels to enable color implementation. In this case, the light emitting layer 240 may be provided such that the plurality of light emitting regions 240a, 240b and 240c belonging to the unit pixel generate light having the same wavelength bandwidth. Here, even when the color conversion layer 350 is further provided, the light emitting layer 240 may be provided such that at least three light emitting regions of the plurality of light emitting regions 240a, 240b, and 240c belonging to the unit pixel generate light having different wavelength bandwidth.

FIGS. 3 and 4 illustrate an example case where the unit pixel has the three light emitting regions 240a, 240b, and 240c and a structure thereof. The micro LED array may have a two-dimensional array of the unit pixel.

The isolation structure 242 may be, for example, an ion injection region. Here, ions may include, for example, nitrogen (N) ions, boron (B) ions, argon (Ar) ions, phosphorus (P) ions, or the like. Since no current flows into the ion injection region, light may not be emitted from the ion injection region. When the isolation structure 242 is formed as the ion injection region, the micro LED array structure may be implemented without an etching process of the light emitting layer 240 for the isolation structure 242.

A first electrode 241 and a second electrode 247 may be provided at both sides of the stacked structure of the light emitting layer 240. The first electrode 241 may be located between the bonding layer 220 and the first semiconductor layer 243 and may be formed to be electrically connected to, for example, the first semiconductor layer 243. The second electrode 247 may be located between the second semiconductor layer 245 and the drive layer 230 and may be formed to be electrically connected to, for example, the second semiconductor layer 245. The first electrode 241 may be a common electrode, and the second electrode 247 may be a pixel electrode. When the first semiconductor layer 243 includes a p-type semiconductor, the first electrode 241 may be the common electrode and may be a p-type electrode. That is, the first electrode 241 may be a p-type common electrode. The second electrode 247 may be, for example, an n-type electrode.

The first electrode 241 may include a reflective material to reflect light emitted from the active layer 244 toward a lower portion of the active layer 244. The first electrode 241 may be formed of an electrode material including, for example, Ag, Au, Al, Cr, Ni, Ti, an alloy thereof, or the like, and may have a single layer structure or a multilayer structure. For example, the first electrode 241 may be formed to have a multilayer structure of Ti/Al/Ti.

The second electrode 247 may be formed as a transparent electrode or an opaque electrode. The transparent electrode may include, for example, indium tin oxide (ITO), ZnO, indium zinc oxide (IZO), IGZO, or the like. When the second electrode 247 is formed as the transparent electrode, the second electrode 247 may be disposed to entirely cover the second semiconductor layer 245. When the second electrode 247 is an opaque electrode, the second electrode 247 may further include a window region 249 such that light emitted from the active layer 244 passes therethrough. For example, the second electrode 247 may be formed of an electrode material including Mo to have the window region 249.

A current blocking layer 246 may be further provided on a region corresponding to the isolation structure 242. The current blocking layer 246 may be formed of, for example, silicon oxide. The current blocking layer 246 may prevent a current from leaking to an adjacent light emitting region. The current blocking layer 246 may be provided between a top surface of the isolation structure 242 and the second electrode 247. When the current blocking layer 246 is provided, the second electrode 247 may be formed on the current blocking layer 246 to extend over the top surface of the second semiconductor layer 245.

An insulating layer 237 may be further provided between the drive layer 230 and the light emitting layer 240. A via hole 238 may be further provided in the insulating layer 237 to electrically connect a drive element 235 to the second electrode 247.

The drive layer 230 may include the drive element 235 electrically connected to each of the light emitting regions 240a, 240b, and 240c of the light emitting layer 240 such that power is applied to each of the plurality of light emitting regions 240a, 240b, and 240c of the light emitting layer 240. The drive element 235 may be electrically connected to the second electrode 247 through the via hole 238. The drive element 235 may include a thin film transistor such that power is applied to each of the light emitting regions 240a, 240b, and 240c. For example, the drive element 235 may include an n-MOS low-temperature polycrystalline silicon (LPTS) thin film transistor. For example, in the drive element 235, an active layer may include low-temperature polycrystalline silicon to form an n-MOS low-temperature polycrystalline silicon (LPTS) thin film transistor. In addition to this, various types of thin film transistors, for example, a high electron mobility transistor (HEMT) and the like may be applied to the drive element 235. The drive layer 230 may further include at least one of insulating layers 231, 232. The insulating layer 232 may be, for example, a gate oxide.

The drive layer 230 and the drive element 235 illustrated in FIGS. 3 and 4 are merely examples, and the drive layer 230 and the drive element 235 applied to the micro LED devices 200 and 300 according to the example embodiments may have various structures.

Referring to FIG. 4, the color conversion layer 350 provided on or over the drive layer 230 may include a plurality of color conversion regions 351, 353, and 355 for converting the light emitted from the active layer 244 into light colors. By further providing the color conversion layer 350 including the plurality of color conversion regions 351, 353, and 355, the micro LED device 300 according to an example embodiment may implement a color micro LED display.

For example, the color conversion regions of the color conversion layer 350 may respectively correspond to the light emitting regions of the light emitting layer 240. When each of the light emitting regions of the light emitting layer 240 corresponds to a pixel, and a unit pixel includes two or more light emitting regions and two or more color conversion regions corresponding, one to one, to the light emitting regions and converting light to different color each other such that a unit pixel enables color to be implemented, the micro LED device 300 according to an example embodiment may be implemented as a color micro LED display.

FIGS. 3 and 4 illustrate an example case where a unit pixel includes first to third light emitting regions 240a, 240b, and 240c of the light emitting layer 240, and first to third color conversion regions 351, 353, and 355 of the color conversion layer 350 correspond, one to one, to the first to the third light emitting regions 240a, 240b, and 240c. In this case, the first color conversion region 351 may convert the light generated in the first light emitting region 240a into first color light. The second color conversion region 353 may convert the light generated in the second light emitting region 240b into second color light. The third color conversion region 355 may convert the light generated in the third emission region 240c into third color light.

For example, the active layer 244 of the light emitting layer 240 may emit blue light. In this case, the blue light is generated in the first, second, and third light emitting regions 240a, 240b, and 240c, and the first, second, and third color conversion regions 351, 353, and 355 may convert the incident blue light into first to third color light. The color conversion layer 350 may include a red conversion region, a green conversion region, and a blue conversion region as the first to the third color conversion regions 351, 353, and 355. The red conversion region corresponds to a red pixel, the green conversion region corresponds to a green pixel, and the blue conversion region may correspond to a blue pixel. In an example embodiment, when the active layer 244 emits blue light, instead of providing a blue conversion region as the third color conversion region 355, a transparent region that makes the light generated in the third light emitting region 240c pass therethrough without color conversion may be provided.

That is, it is considered that a case where, when the active layer 244 of the light emitting layer 240 emits blue light and the unit pixel includes the red pixel, the green pixel, and the blue pixel, the unit pixel includes the first to the third light emitting regions 240a, 240b, and 240c of the light emitting layer 240, and the color conversion layer 350 includes the first to the third color conversion regions 351, 353, and 355. In this case, the first color conversion region 351 of the color conversion layer 350 may be formed as a red conversion region that converts the blue light generated in the first light emitting region 240a into first color light, for example, red light. The second color conversion region 353 of the color conversion layer 350 may be formed as a green conversion region that converts the blue light generated in the second light emitting region 240b into second color light, for example, green light. The third color conversion region 355 of the color conversion layer 350 may be formed as a blue conversion region that converts the blue light generated in the third light emitting region 240c into blue light having a changed spectral range, or may be a transparent region that makes light pass therethrough without color conversion.

As described above, the first color conversion region 351, for example, the red conversion region may change the blue light emitted from the active layer 244 into red light and emit the red light. The red conversion region may include, for example, QDs of a predetermined size that are excited by the blue light and emit red light. In addition, the red conversion region may include a phosphor which is excited by the blue light emitted from the active layer 244 and emits the red light. The red conversion region may further include a photoresist or a light scattering agent.

The second color conversion region 353, for example, a green conversion region may the light emitted from the active layer 244 into green light and emit the green light. The green conversion region may include, for example, QDs of a predetermined size that are excited by the blue light and emit green light. In addition, the green conversion region may also include a phosphor that is excited by the light emitted from the active layer 244 and emits the green light. The green conversion region may further include a photoresist having good transmission characteristics or a light scattering agent that uniformly emits green light.

In the red conversion region and the green conversion region, the QDs may have a core-shell structure including a core portion and a shell portion or may have a particle structure without a shell. The core-shell structure may have a single shell or multi-shells. The multi-shells may be, for example, double-shells. The QD may include, for example, at least one of a Group II-VI-based semiconductor, a group III-V-based semiconductor, a Group IV-based semiconductor, and graphene QDs. As an example, the QD may include at least one of Cd, Se, Zn, S, and InP, and is not limited thereto. Each QD may have a diameter less than or equal to several tens of nm, for example, a diameter less than or equal to approximately 10 nm.

The third color conversion region 355 may be a transparent region via which blue light emitted from the active layer 244 pass and is emitted to the outside. In addition, when the blue light is emitted from the active layer 244, the third color conversion region 355 may be provided as a blue conversion region, and at this time, the blue conversion region may include QDs of a predetermined size that are excited by, for example, the blue light to emit the blue light having a changed spectral bandwidth. In the blue conversion region, the QD may have a core-shell structure including a core portion and a shell portion or may have a particle structure without a shell. The core-shell structure may have a single shell or multi-shells. The third color conversion region 355 may further include a photoresist having good transmission characteristics or a light scattering agent that uniformly emits the blue light.

FIGS. 3 and 4 illustrate a case where a unit pixel includes three pixels, that is, one red pixel, one green pixel, and one blue pixel, which is merely an example and the example embodiments of the disclosure are not limited thereto. For example, the micro LED device 300 and 400 according to example embodiments implemented as a color micro LED display may include four pixels, for example, one red pixel, two green pixels, and one blue pixel. In this case, the color pixels may be arranged in, for example, a Bayer pattern.

In addition, the light emitted from the active layer 244 is not limited to blue light and may be light having a different wavelength as long as the light may excite the first to the third color conversion regions 351, 353, and 355, and the first to the third color conversion regions 351, 353, and 355 of the color conversion layer 350 may be provided to convert incident light into color light for color display, for example, red light, green light, and blue light, according to a wavelength of the light generated in the active layer 244.

The color conversion layer 350 may further include partition walls 357 between the color conversion regions 351, 353, and 355 adjacent to each other. A side surface of the partition wall 357 may be formed as a reflective surface, thereby, increasing extraction efficiency of color light converted in each color conversion regions 351, 353, and 355 to be output. In addition, the partition wall 357 may be configured with a black matrix for absorbing light. The black matrix may improve contrast by preventing color crosstalk between the color conversion regions.

In the above-described structure, for example, if the drive element 235 corresponding to the red pixel is driven to apply a predetermined voltage between the first electrode 241 and the second electrode 247 corresponding to the red pixel, blue light is emitted from the active layer 244 of the first light emitting region 240a located below the red color conversion region, that is, the first color conversion region 351, and the blue light emitted is converted into red light in the first color conversion region 351 to be emitted to the outside.

In addition, for example, if the drive element 235 corresponding to a green pixel is driven and a predetermined voltage is applied between the first electrode 241 which is a common electrode and the second electrode 247 corresponding to the green pixel, the blue light is emitted from the active layer 244 of the second light emitting region 240b located below the green conversion region 352, that is, the second color conversion region 353, and the emitted blue light is incident on the second color conversion region 353 to be converted into green light and emitted to the outside.

In addition, for example, if the drive element 235 corresponding to the blue pixel is driven to apply a predetermined voltage between the first electrode 241 which is the common electrode and the second electrode 247 corresponding to the blue pixel, for example, blue light is emitted from the active layer 244 located below the blue conversion region, that is, the third color conversion region 355, and the blue light passes through the third color conversion region to be emitted to the outside.

Since the micro LED device 200 and 300 according to example embodiments have a structure including a light emitting layer 240 on the support substrate 210 and the drive layer 230 on the light emitting layer 240, the light emitting layer 240 may be bonded to the support substrate 210 in a state where a semiconductor stacked structure of the light emitting layer 240 is grown on a growth substrate, and the growth substrate may be removed, and then, a process of manufacturing the drive element 235 of the drive layer 230 or a subsequent process of manufacturing the color conversion layer 350 may be performed.

In a process of manufacturing the micro LED devices 100, 200, and 300 according to example embodiments, a GaN-based semiconductor stacked structure of the light emitting layer 240 may be grown on the growth substrate through a relatively high temperature process. In addition, a subsequent process may be performed in a state where the light emitting layer 240 is bonded to the support substrate 210 through a bonding process.

Sapphire, silicon, etc. are mainly used as the growth substrate used for epitaxy of a Group III-V GaN-based LED, and a large-area substrate is used for improving yield of a process. A GaN-based micro LED may be manufactured based on a large-area silicon substrate, and when the silicon substrate is used, there is an advantage in implementing the drive circuit. When a GaN-based LED is manufactured in the large-area silicon substrates, for example, a silicon wafer having a thickness of approximately 1 to 2 mm, which is hundred times, for example, about 150 times through about 250 times a thickness (within an approximately 7 μm GaN-based semiconductor layer), is required to be used, in consideration of stress applied due to a high-temperature growth of metal organic chemical vapor deposition (MOCVD).

In order to implement the micro LED devices 100, 200, and 300 according to example embodiments as micro LED displays, a relatively thick and heavy growth substrate may be used for a large-area process.

Therefore, even when the micro LED devices 100, 200, and 300 according to example embodiments are manufactured, a silicon wafer having a thickness of approximately 1 to 2 mm, for example, approximately 1.5 mm may be used as a growth substrate in consideration of stress generated in a high-temperature growth of a GaN-based light emitting layer semiconductor stacked structure.

For example, a silicon substrate having a first thickness such as a thickness of approximately 1.5 mm may be used as a growth substrate such that the micro LED devices 100, 200, and 300 according to example embodiments may be manufactured in a large-area process.

A process of manufacturing is not easily performed due to a thickness and a weight of a growth substrate for the large-area process.

Therefore, a subsequent process is generally performed in a state where a semiconductor stacked structure of a light emitting layer is formed in the growth substrate and a thickness of the growth substrate is reduced through a thin wafer process.

That is, the thin wafer process is performed after a semiconductor stacked structure of an LED requiring a high-temperature growth is formed in a silicon substrate having a first thickness such as a thickness of approximately 1.5 mm. The thickness of the silicon substrate having the first thickness is reduced by approximately half to become a second thickness such as a thickness of approximately 0.75 mm through the thin wafer process, and a fabrication processes such as an etching process, a lithography process, and a metal deposition process is performed to form an LED structure for the thinned growth substrate.

When the micro LED device is manufactured by applying the thin wafer process, the thickness of the growth substrate is reduced to approximately half in a state where the GaN-based LED semiconductor stacked structure is formed in the growth substrate, a fabrication (Fab.) process for an LED structure and a p-MOS element process for forming a thin film transistor which is a drive element are performed, a support substrate is bonded to the thinned growth substrate, the remaining growth substrate is removed secondly, and the rest of the process is performed.

Here, the thinned growth substrate is advantageous in a manufacturing process, while compressive and/or tensile stress is greatly increased during a thin film process, and thus, a breakage of the thinned growth substrate may occur due to a damage in a handling process during the manufacturing process, and/or a damage due to a strain may occur during deposition/etching of a process of manufacturing the micro LED device. In addition, a thin wafer process is first performed for the growth substrate, a process of completely removing the thinned growth substrate bonded to the support substrate is additionally performed. Accordingly, removing the growth substrate is performed twice, and thus, it is difficult to simplify the manufacturing process.

However, the micro LED devices 100, 200, and 300 of example embodiments have a structure in which the light emitting layer 240 is bonded onto the support substrate 210 and the drive layer 230 is located on the light emitting layer 240, and thus, a semiconductor stacked structure of the light emitting layer 240 requiring a high-temperature growth is formed based on the growth substrate, the growth substrate is completely removed in a state where the light emitting layer 240 is bonded to the support substrate, and thereafter a subsequent process such as a process of forming the drive layer 230 and a process of forming the color conversion layer 350 may be performed. An n-MOS element process is performed in a low temperature process to form a thin film transistor which is the drive element 235 of the drive layer 230.

Therefore, according to the micro LED devices 100, 200, and 300 of example embodiments, since a subsequent process may be performed after a growth substrate is completely removed in a single process, process stress is reduced such that the possibility of a substrate breakage is significantly reduced, and a process tact time is reduced to significantly reduce the possibility of an in-process breakage. Also, since a subsequent process is performed after a mechanical strength increases due to bonding of a support substrate, a micro LED device according to example embodiments may be robust to a breakage.

In addition, according to the micro LED devices 100, 200, and 300 of example embodiments, since an n-type thin film transistor is applied to the drive element 235 of the drive layer 230, mobility thereof is superior to mobility of a p-type thin film transistor, resulting in reducing a width to length ratio (e.g., width/length (W/L)) of a drive thin film transistor at the same pixel current, and thereby, a pixels per inch (PPI) pixel circuit may be easily implemented.

Therefore, according to the micro LED devices 100, 200, and 300 of example embodiments, a high-resolution micro LED device robust to a breakage may be implemented.

Hereinafter, processes for manufacturing the micro LED devices according to example embodiments will be described in detail with reference to FIGS. 5 to 14. FIGS. 5 to 14 illustrate example processes for manufacturing the micro LED devices 200 and 300 of FIGS. 3 and 4 and may be applied to manufacturing the micro LED device 100 of FIGS. 1 and 2. Substantially the same configuration elements are denoted by the same reference numerals, and repetitive description may be omitted.

Figure 5:
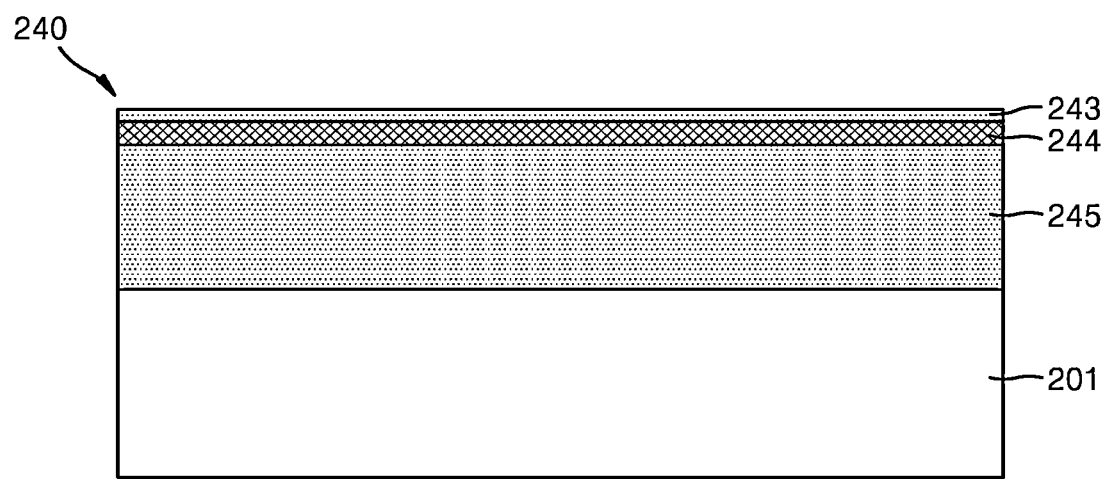
FIGS. 5 to 14 illustrate processes for manufacturing the micro LED devices according to example embodiments.

In order to manufacture the micro LED devices 200 and 300 according to example embodiments, a stacked structure of the second semiconductor layer 245, the active layer 244, and the first semiconductor layer 243 for the light emitting layer 240 is grown on a growth substrate 201, as illustrated in FIG. 5. For example, a silicon substrate or a sapphire substrate may be used as the growth substrate 201.

The second semiconductor layer 245 may be formed of, for example, an undoped semiconductor, that is, a u-type semiconductor or an n-type doped semiconductor, that is, an n-type semiconductor. The second semiconductor layer 245 may include a Group III-V-based u-type semiconductor such as u-GaN or an n-type semiconductor such as n-GaN. The second semiconductor layer 245 may have a single layer structure or a multilayer structure.

The active layer 244 may be formed to have an MQW structure or an SQW structure to generate light while electrons combine with holes. The active layer 244 may include a Group III-V-based semiconductor such as GaN.

The first semiconductor layer 243 may be formed of a first type semiconductor. For example, the first semiconductor layer 243 may be formed of a p-type semiconductor. The first semiconductor layer 243 may include a Group III-V-based p-type semiconductor such as p-GaN. The first semiconductor layer 243 may have a single layer structure or a multilayer structure.

For example, a stacked structure of the second semiconductor layer 245, the active layer 244, and the first semiconductor layer 243 for the light emitting layer 240 may be formed by growing GaN on a silicon substrate having a thickness of approximately 1.5 mm. For example, the GaN stacked structure of the light emitting layer 240 may be configured with u-GaN, MQW, and p-GaN, and a thickness thereof may be formed to be less than or equal to approximately 7 μm.

Figure 6:
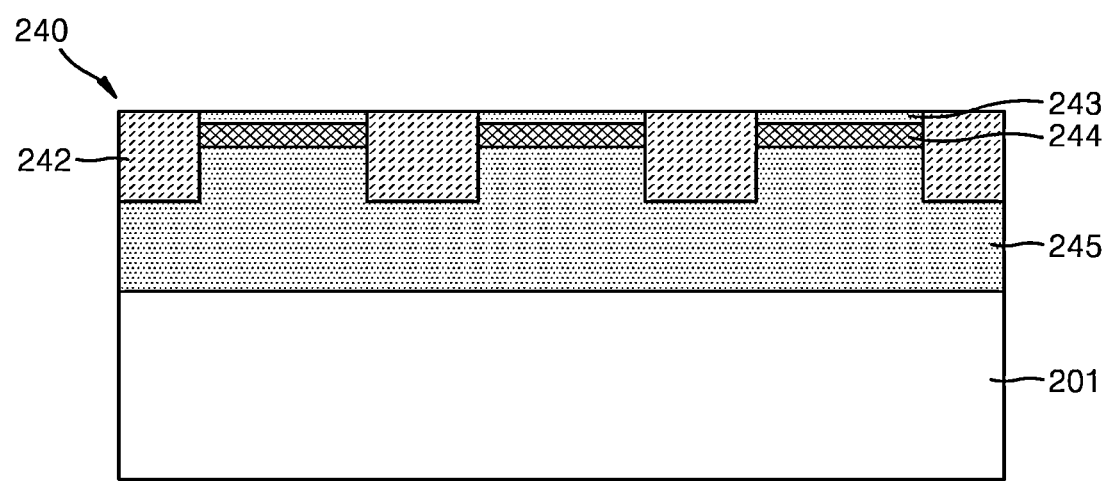

Next, as illustrated in FIG. 6, in order to form the isolation structure 242 such that the light from the active layer 244 of the light emitting layer 240 is emitted in units of each of the light emitting regions 240a, 240b, and 240c, an ion injection process may be performed. Here, ions may include, for example, nitrogen (N) ions, boron (B) ions, argon (Ar) ions, phosphorus (P) ions, etc. Since no current flows into the ion injection region, light may not be emitted from the ion injection region. Therefore, by forming the isolation structure 242 by using the ion injection process, the light emitting regions 240a, 240b, and 240c may be formed to respectively correspond to pixels. Ion injection for forming the isolation structure 242 may be performed to a predetermined depth (e.g., a partial depth) of the second semiconductor layer 245.

When the isolation structure 242 is formed as an ion injection region, the micro LED array structure may be implemented without an etching process of the light emitting layer 240 for the isolation structure 242. In addition, through a process for forming the isolation structure 242, the light from the active layer 244 of the light emitting layer 240 may be emitted in units of pixels, and each of the light emitting regions 140a, 140b, and 140c may correspond to the pixel. The unit pixel may include a single light emitting region or may include two or more light emitting regions to enable color implementation.

Figure 7:
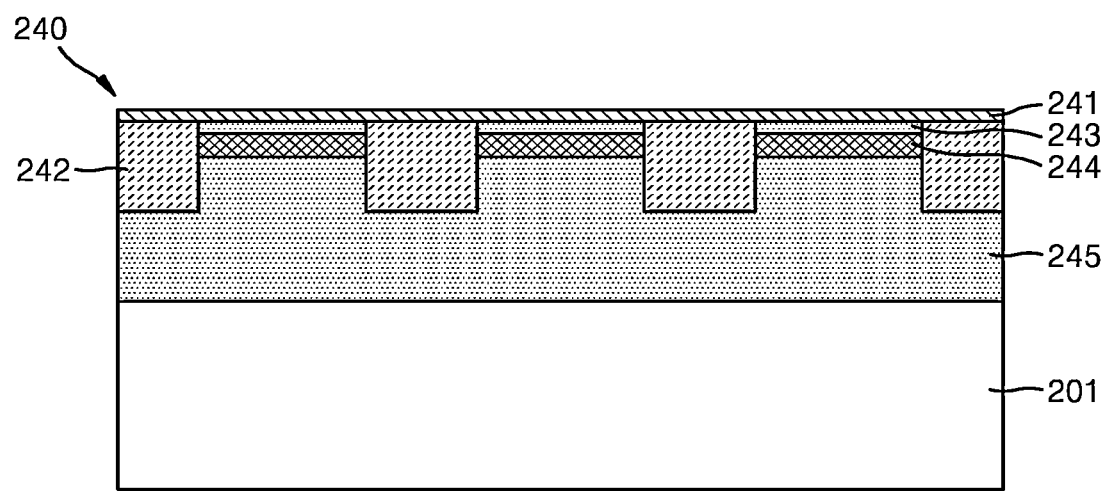

Next, as illustrated in FIG. 7, the first electrode 241 may be formed on the first semiconductor layer 243. The first electrode 241 may be a common electrode or a p-type electrode. The first electrode 241 may be formed on or over the entirety of the stacked structure of the light emitting layer 240. The first electrode 241 may include a reflective material to reflect light emitted from the active layer 244 toward the first electrode 241. For example, the first electrode 241 may be formed of an electrode material including, for example, Ag, Au, Al, Cr, Ni, Ti, an alloy thereof, etc. and may be formed to have a single layer structure or a multilayer structure. For example, the first electrode 241 may have a multilayer structure of Ti/Al/Ti.

Figure 8:
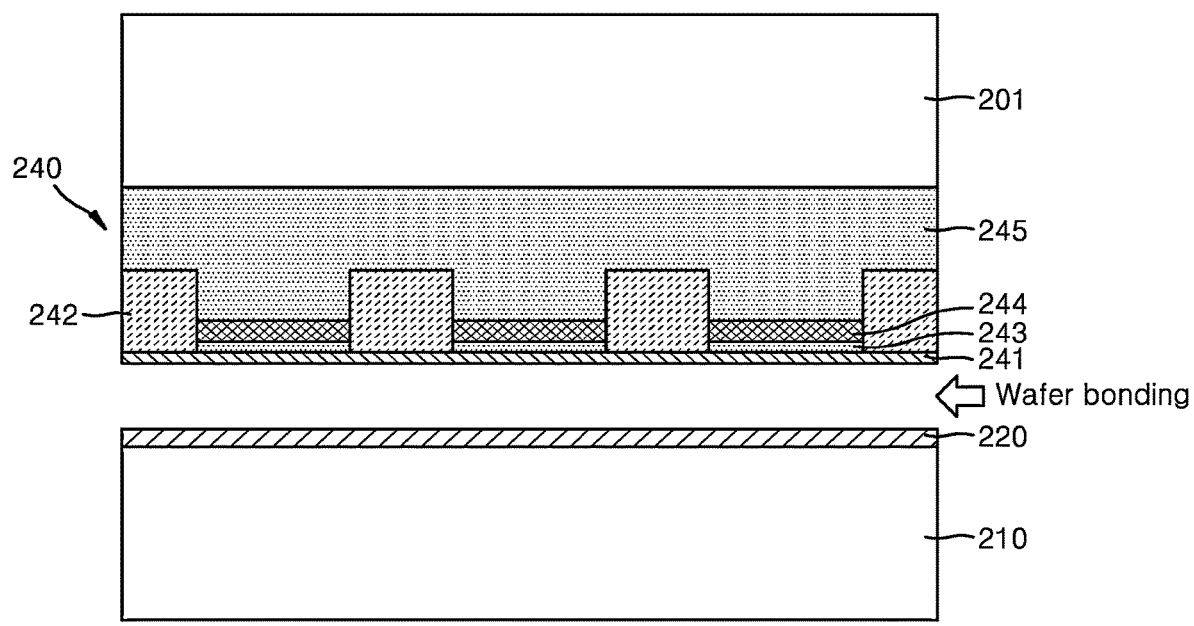

Next, as illustrated in FIG. 8, the growth substrate 201 is turned upside down such that the first electrode 241 of the growth substrate 201 faces the support substrate 210, and in this state, the light emitting layer 240 is bonded to the support substrate 210. The bonding layer 220 may be formed between the support substrate 210 and the first electrode 241 of the growth substrate 201.

The support substrate 210 is a substrate different from a growth substrate in which the light emitting layer 240 is formed through a semiconductor deposition process, for example, an epitaxial substrate, and for example, a silicon substrate, a glass substrate, a sapphire substrate, a silicon substrate coated with $SiO_2$, or the like may be used as the support substrate. However, these substrates are merely examples, and various other materials may be used as the support substrate 210.

The bonding layer 220 may be a layer formed by bonding the light emitting layer 240 to the support substrate 210 and may be a layer formed through, for example, adhesive bonding, eutectic bonding, or direct bonding. For example, an epoxy resin or a resin such as a silicone group, benzocyclobutene (BCB), a polysilazane group, or a siloxane group may be used for the adhesive bonding. In addition, the adhesive bonding may be performed by using a SOG method. The eutectic bonding may use a metal. The direct bonding may be performed by, for example, plasma, ion beam processing, etc. The bonding layer 220 may be used to physically bond the light emitting layer 240 to the support substrate 210, and thus, the light emitting layer 140 may be bonded to the support substrate 110 by using a bonding method without an electrical connection.

FIG. 8 illustrates that the bonding layer 220 is formed on the support substrate 210, but this is merely an example and the bonding layer 220 may be formed on the light emitting layer 240 or may be formed during the bonding process.

Figure 9:
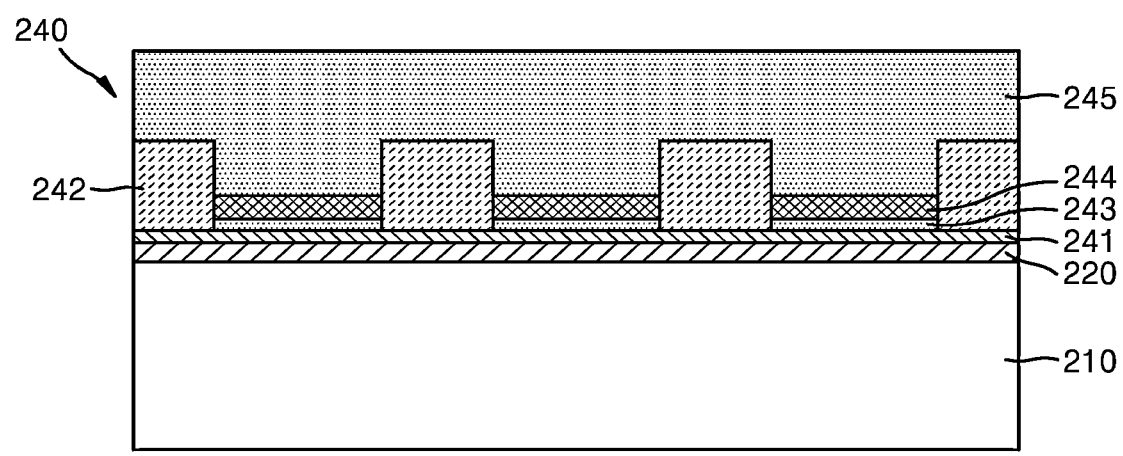

Next, as illustrated in FIG. 9, the growth substrate 201 on the light emitting layer 240 may be removed to expose the second semiconductor layer 245.

Figure 10:
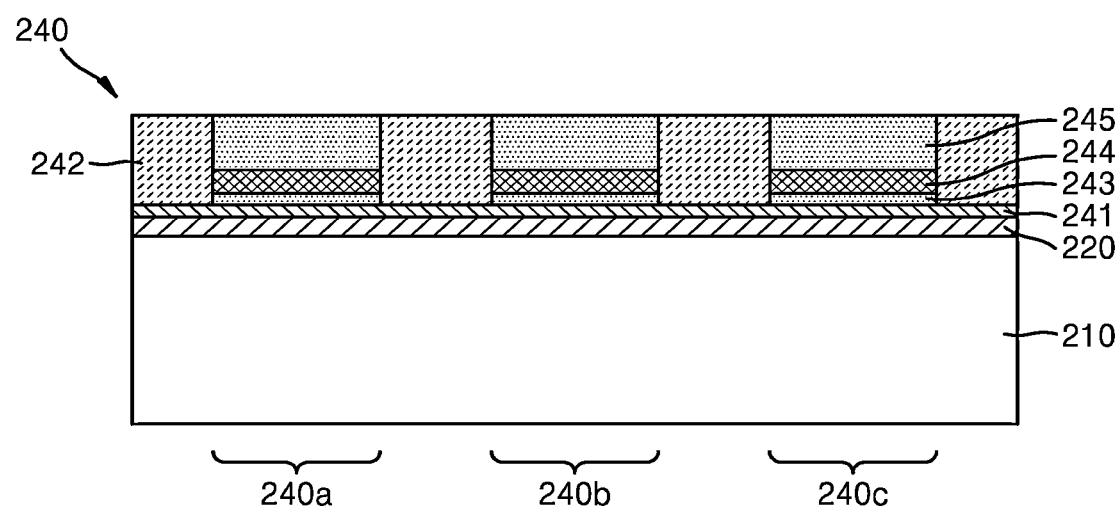

Subsequently, an etching process may be performed on the entire surface of the second semiconductor layer 245 as illustrated in FIG. 10. By removing a part of a thickness of the second semiconductor layer 245 through the etching process, the second semiconductor layer 245 may have a desirable thickness such as a thickness of approximately 500 nm. For example, the second semiconductor layer 245 may be a GaN layer and may be etched to have a thickness less than or equal to approximately 500 nm.

The process of removing a partial thickness of the second semiconductor layer 245 may be performed until at least an end portion of the isolation structure 242 is exposed. Here, the etching process may also be performed until a partial thickness of the isolation structure 242 is removed.

As described above, a plurality of light emitting regions 240a, 240b, and 240c may be formed by exposing the end portion of the isolation structure 242 to partition the light emitting layer 240 by the isolation structure 242. The light emitting layer 240 may have the isolation structure 242 between adjacent light emitting regions. When the micro LED devices 200 and 300 according to example embodiments are implemented as micro LED displays, the light emitting regions 240a, 240b, and 240c may respectively correspond to pixels. The unit pixel may include a plurality of light emitting regions, for example, three light emitting regions 240a, 240b, and 240c, or four or more light emitting regions, and the micro LED devices 200 and 300 according to example embodiments may have a two-dimensional array of the unit pixel.

Figure 11:
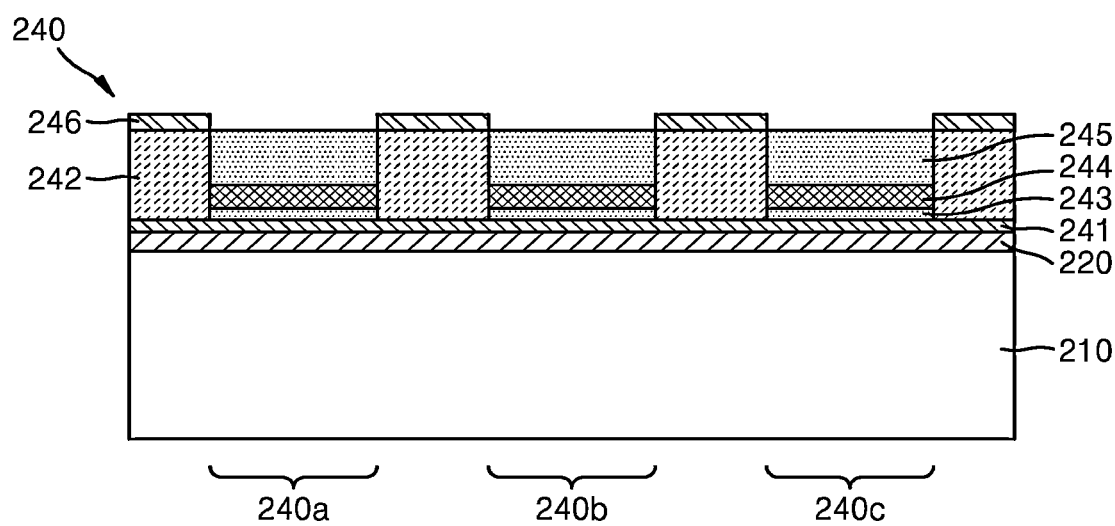

Next, as illustrated in FIG. 11, the current blocking layer 246 may be formed on a region corresponding to the isolation structure 242. The current blocking layer 246 may be formed of, for example, silicon oxide. The current blocking layer 246 may prevent a current from leaking to the adjacent light emitting region.

Figure 12:
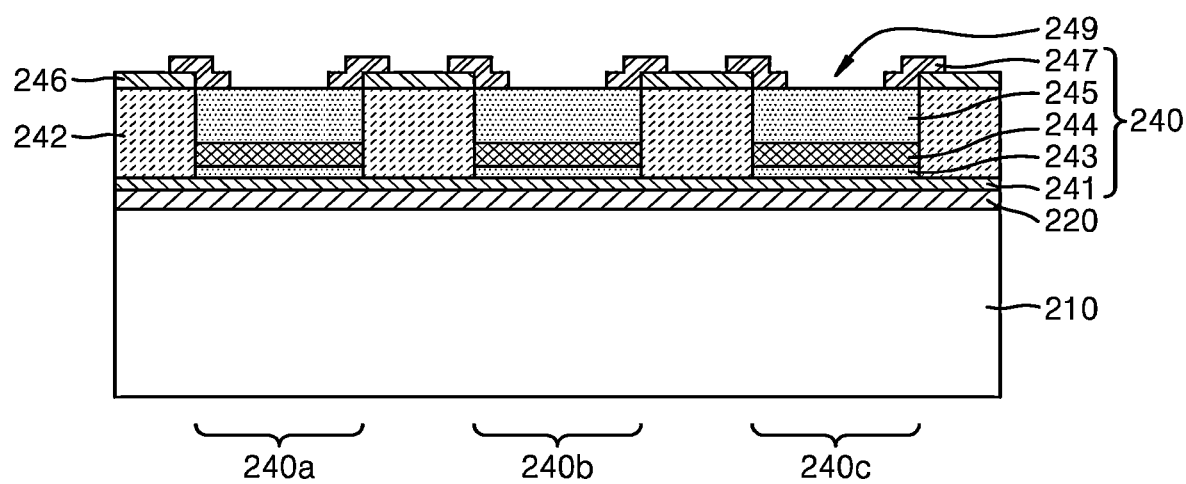

Next, as illustrated in FIG. 12, the second electrode 247 may be formed on the current blocking layer 246 to extend over the top surface of the second semiconductor layer 245. The second electrode 247 may be, for example, an n-type electrode.

The second electrode 247 may be formed as a transparent electrode or an opaque electrode. The transparent electrode may include, for example, indium tin oxide (ITO), ZnO, indium zinc oxide (IZO), IGZO, etc. When the second electrode 247 is formed as the transparent electrode, the second electrode 247 may be disposed to entirely cover the second semiconductor layer 245. When the second electrode 247 is an opaque electrode, the second electrode 247 may further include the window region 249 to make the light emitted from the active layer 244 pass therethrough. FIG. 12 illustrates an example in which the second electrode 247 is formed to have the window region 249. For example, the second electrode 247 may be formed of an electrode material including Mo to have the window region 249.

For example, a fine pattern structure (not illustrated) or the like may be further formed on an upper surface of or near the second semiconductor layer 245 to increase efficiency of the light generated by the active layer 244 and extracted through the second semiconductor layer 245. The fine pattern structure may be formed after the second electrode 247 is formed or may be formed before the second electrode 247 is formed or before the current blocking layer 246 is formed.

Figure 13:
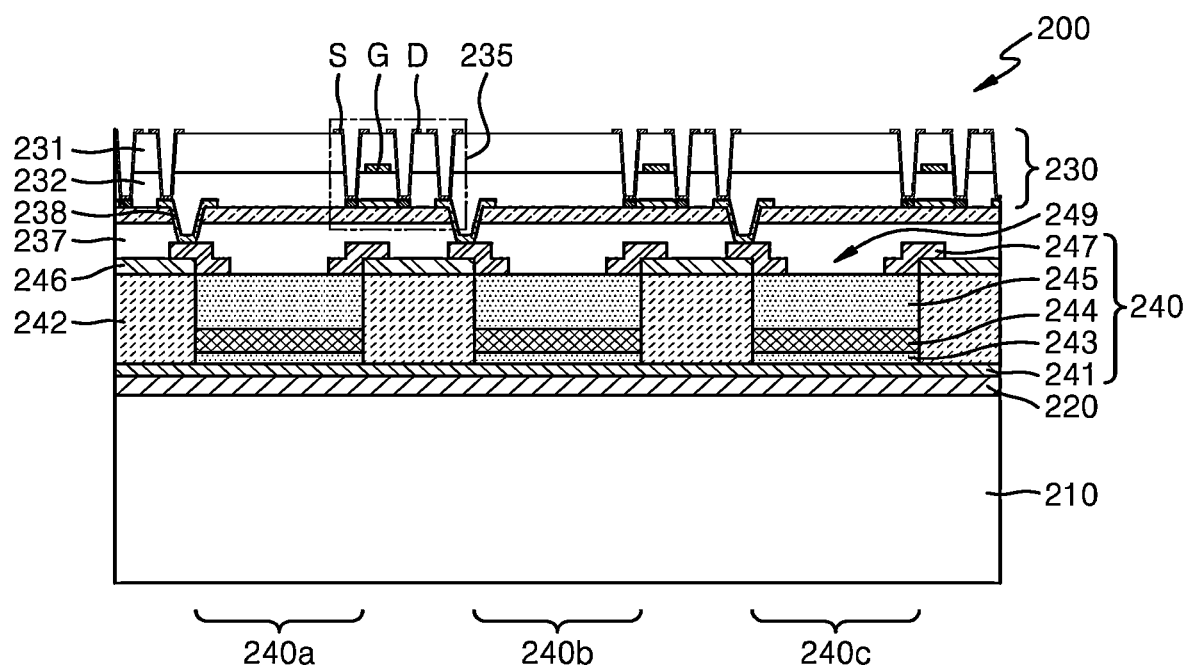

Next, as illustrated in FIG. 13, the insulating layer 237 may be formed on the light emitting layer 240, and the drive layer 230 including the drive element 235 may be formed on the insulating layer 237. The via hole 238 may be further formed in the insulating layer 237 to electrically connect the drive element 235 to the second electrode 247.

The drive layer 230 may include the drive element 235 electrically connected to each of the light emitting regions 240a, 240b, and 240c of the light emitting layer 240 such that power is applied to each of the plurality of light emitting regions 240a, 240b, and 240c of the light emitting layer 240. The drive element 235 may be electrically connected to the second electrode 247 through the via hole 238.

The drive element 235 may include a thin film transistor such that the power is applied to each of the plurality of light emitting regions 240a, 240b, and 240c. For example, the drive element 235 may be formed of an n-MOS low-temperature polycrystalline silicon (LPTS) thin film transistor. For example, an active layer of the drive element 235 may include low-temperature polycrystalline silicon to form an n-MOS low-temperature polycrystalline silicon (LPTS) thin film transistor. In addition, the drive element 235 may include various types of thin film transistors, for example, a high electron mobility transistor (HEMT) and the like. The drive layer 230 may further include at least one of insulating layer 231, 232, and the insulating layer 232 may include, for example, a gate oxide.

By forming the drive layer 230 in this manner, the micro LED device 200 may be obtained.

Figure 14:
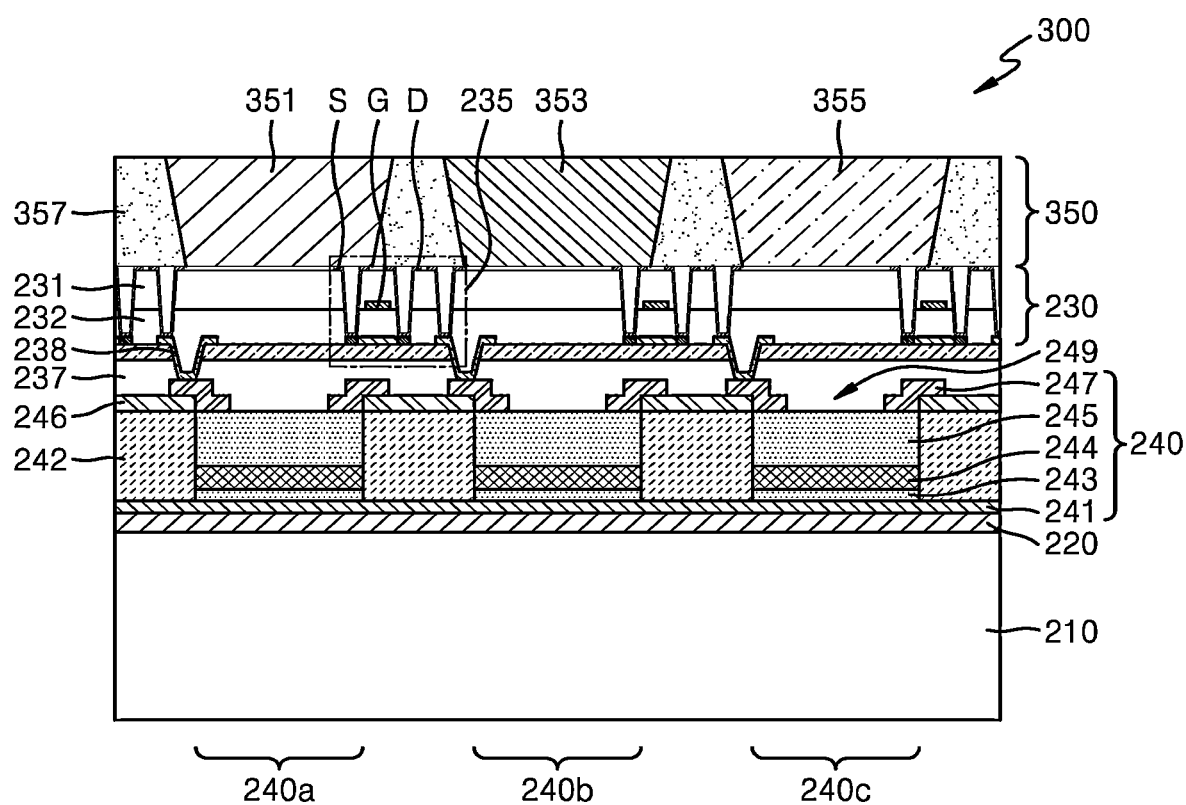

Additionally, as illustrated in FIG. 14, the color conversion layer 350 including the plurality of color conversion regions 351, 353, and 355 for converting light emitted from the active layer 244 into light colors may be further provided on or over the drive layer 230. By further providing the color conversion layer 350 including the plurality of color conversion regions 351, 353, and 355, the micro LED device 300 according to an example embodiment may be obtained to implement a color micro LED display.

The color conversion regions of the color conversion layer 350 may respectively correspond to light emitting regions of the light emitting layer 240.

For example, a unit pixel may include the first to the third light emitting regions 240a, 240b, and 240c of the light emitting layer 240, and the first to the third color conversion regions 351, 353, and 355 of the color conversion layer 350 may respectively correspond to the first to the third light emitting regions 240a, 240b, and 240c. The first color conversion region 351 may convert the light generated in the first light emitting region 240a, for example, blue light into a first color light, for example, red light. The second color conversion region 353 may convert the light generated in the second light emitting region 240b, for example, blue light into a second color light, for example, red light. The third color conversion region 355 may convert the light generated in the third light emitting region 240c, for example, blue light into a third color light or to make the light pass therethrough without color conversion.

The first to the third color conversion regions 351, 353, and 355 of the color conversion layer 350 may be respectively a red conversion region, a green conversion region, and a blue conversion region, and may respectively correspond to a red pixel, a green pixel, and a blue pixel The first color conversion region 351, for example, the red conversion region may be formed to include QDs of a predetermined size or phosphors that are excited by blue light to emit red light. In addition, the red conversion region may further include a photoresist having good transmission characteristics or a light scattering agent that uniformly emits red light.

The second color conversion region 353, for example, the green conversion region may be formed to include QDs of a predetermined size or phosphors that are excited by the blue light to emit green light. The green conversion region may further include a photoresist having good transmission characteristics or a light scattering agent that uniformly emits green light.

The third color conversion region 355 may be provided as a transparent region or a blue conversion region that makes blue light emitted from the active layer 244 pass therethrough and emits the blue light to the outside. At this time, the blue conversion region may include, for example, QDs of a predetermined size or phosphors that are excited by the blue light to emit blue light having a changed spectral bandwidth. The blue conversion region may further include a photoresist having good transmission characteristics or a light scattering agent that uniformly emits the blue light.

The color conversion layer 350 may be formed to further include the partition wall 357 between the color conversion regions 351, 353, and 355 adjacent to each other. A side surface of the partition wall 357 may be formed as a reflective surface or may be configured by a black matrix for absorbing light.

In the micro LED devices 200 and 300 described above, for example, when the drive element 235 corresponding to the red pixel is driven to apply a predetermined voltage between the first electrode 241 and the second electrode 247 corresponding to the red pixel, blue light is emitted from the active layer 244 of the first light emitting region 240*a* located below the red color conversion region, that is, the first color conversion region 351, and the blue light emitted is converted into red light in the first color conversion region 351 to be emitted to the outside.

In addition, for example, when the drive element 235 corresponding to a green pixel is driven and a predetermined voltage is applied between the first electrode 241 which is a common electrode and the second electrode 247 corresponding to the green pixel, the blue light is emitted from the active layer 244 of the second light emitting region 240*b* located below the green conversion region, that is, the second color conversion region 353, and the emitted blue light is incident on the second color conversion region 353 to be converted into green light and emitted to the outside.

In addition, for example, when the drive element 235 corresponding to the blue pixel is driven to apply a predetermined voltage between the first electrode 241 which is the common electrode and the second electrode 247 corresponding to the blue pixel, for example, blue light is emitted from the active layer 244 located below the blue conversion region, that is, the third color conversion region 355, and the blue light passes through the third color conversion region to be emitted to the outside.

The process of manufacturing the micro LED devices 200 and 300 described above with reference to FIGS. 5 to 14 may be applied to the process of manufacturing the micro LED device 100 of FIGS. 1 and 2 in the same manner.

According to the micro LED devices 100, 200, and 300 of example embodiments described above, since a subsequent process may be performed after a growth substrate is completely removed in a single process, process stress is reduced such that the possibility of a substrate breakage is significantly reduced, and a process tact time is reduced to significantly reduce the possibility of an in-process breakage. Also, since a subsequent process is performed after a mechanical strength increases due to bonding of a support substrate, a micro LED device according to example embodiments may be robust to a breakage.

In addition, according to the micro LED devices 100, 200, and 300 of example embodiments, since an n-type thin film transistor is applied to the drive element 235 of the drive layer 230, mobility thereof is superior to mobility of a p-type thin film transistor, resulting in reducing a width/length (W/L) of a drive thin film transistor at the same pixel current, and thereby, a PPI pixel circuit may be easily implemented.

Figure 15:
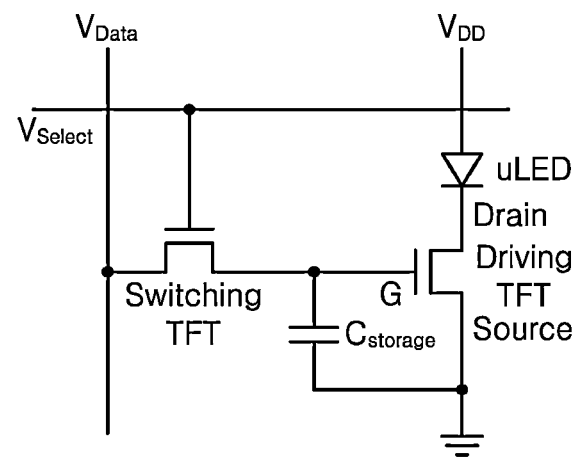
FIG. 15 schematically illustrates an n-type pixel circuit when a drive element is implemented as an n-type thin film transistor by applying micro LED devices according to example embodiments.
Figure 16:
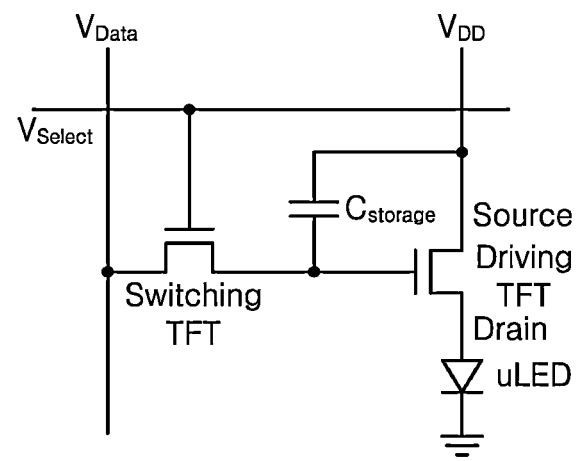
FIG. 16 is a comparative example schematically illustrating a p-type pixel circuit when a drive element is implemented as a p-type thin film transistor in a micro LED device according to an example embodiment.
Figure 17:
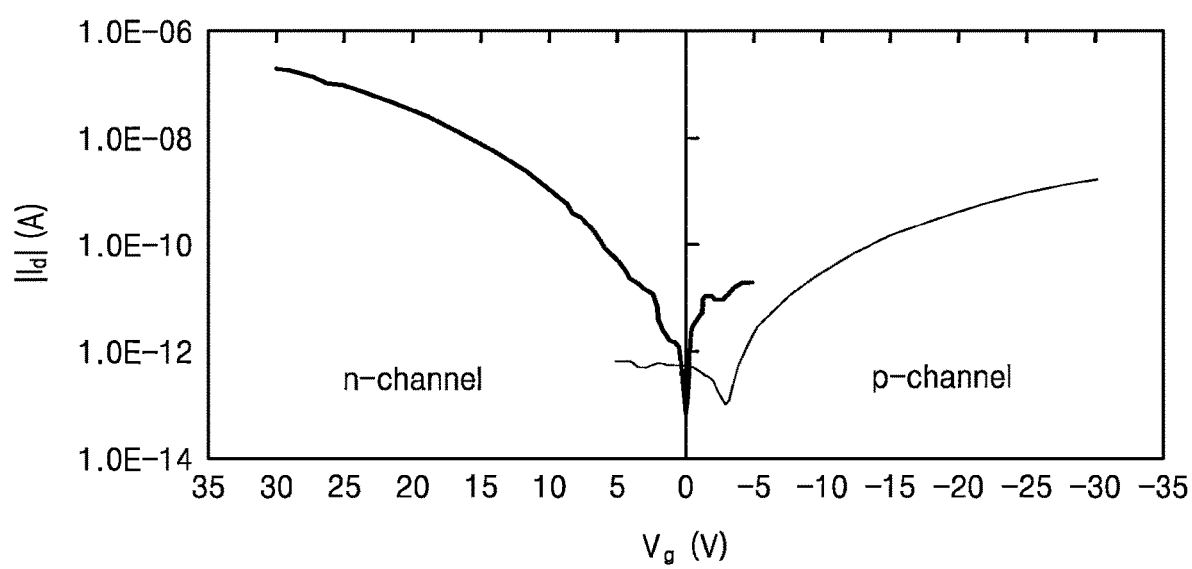
FIG. 17 illustrates transfer characteristics of an n-channel thin film transistor and a p-channel thin film transistor.

FIG. 15 schematically illustrates an n-type pixel circuit when the drive element 235 is implemented as an n-type thin film transistor by applying the micro LED devices 100, 200, and 300 according to example embodiments. FIG. 16 is a comparative example schematically illustrating a p-type pixel circuit when the drive element is implemented as a p-type thin film transistor in the micro LED device. FIG. 17 illustrates transfer characteristics of an n-channel thin film transistor and a p-channel thin film transistor.

As can be seen from the transfer characteristics of FIG. 17, as in FIG. 15, when the micro LED devices 100, 200, and 300 according to an example embodiment are applied to implement an n-type pixel circuit, mobility thereof may be superior to mobility of a p-type pixel circuit to which the micro LED device of the comparative example of FIG. 16 is applied. Therefore, according to the PPI pixel circuit to which the micro LED devices 100, 200, and 300 according to an example embodiment are applied, the width/length (W/L) of the drive thin film transistor (TFT) can be reduced at the same pixel current, thereby implementing a high PPI pixel further easier.

As described above, according to the micro LED devices 100, 200, and 300 of example embodiments, since an n-type thin film transistor is applied thereto, mobility thereof is superior to mobility of a p-type thin film transistor, resulting in reducing a width/length (W/L) of a drive thin film transistor at the same pixel current, and thereby, a PPI pixel circuit is easily implemented, resulting in enabling a high-resolution micro LED device robust to a breakage.

Although the above-described micro LED device 100, 200, and 300, and a method of manufacturing the same are described with reference to example embodiments illustrated in the drawings, these are merely illustrative, and those skilled in the art should understand that various modifications and other equivalent embodiments are possible. While many details are set forth in the foregoing description, those should be construed as illustrations of example embodiments rather than to limit the scope of the disclosure. Therefore, the scope of the disclosure should not be determined by the described embodiments.

According to the micro LED devices of example embodiments, a structure is provided in which a light emitting layer is formed on a support substrate and a drive layer is formed on the light emitting layer, the light emitting layer may be bonded to the support substrate in a state where a semiconductor stacked structure of the light emitting layer requiring a high-temperature process is grown on a growth substrate, and the growth substrate may be removed, and then, a process of manufacturing a drive element of the drive layer or a subsequent process of manufacturing a color conversion layer may be performed, and thus, a process tact time is reduced to significantly reduce the possibility of an in-process breakage. Also, since a subsequent process is performed after a mechanical strength increases due to bonding of a support substrate, a micro LED device robust to a breakage may be implemented according to an example embodiment. In addition, according to an example embodiment, since an n-type thin film transistor is applied to a drive element of a drive layer, mobility thereof is superior to mobility of a p-type thin film transistor, resulting in reducing a width/length (W/L) of a drive thin film transistor at the same pixel current, and thereby, a PPI pixel circuit may be easily implemented, resulting in implementing a high-resolution micro LED device robust to a breakage.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A micro light emitting diode (LED) display, comprising:
    a support substrate;
    a light emitting layer provided on the support substrate, the light emitting layer comprising:
    a stacked structure including a first semiconductor layer, an active layer, and a second semiconductor layer;
    a first electrode and a second electrode provided on a first side and a second side of the stacked structure, respectively; and
    a plurality of light emitting regions each corresponding a pixel;
    a bonding layer between the support substrate and the light emitting layer;
    a drive layer provided on the light emitting layer and comprising a drive element, the drive element being electrically connected to the light emitting layer and configured to apply power to the plurality of light emitting regions of the light emitting layer; and
    a color conversion layer including a plurality of color conversion regions for converting a light emitted from the light emitting layer into light colors,
    wherein the support substrate is a separate substrate from a growth substrate on which the stacked structure of the light emitting layer is formed through a semiconductor deposition process, and the bonding layer is formed between the support substrate and the light emitting layer by bonding the support substrate to the growth substrate.

2. The micro LED display of claim 1, wherein the light emitting layer further comprises an isolation structure that separates the plurality of light emitting regions from each other.

3. The micro LED display of claim 2, wherein the drive element of the drive layer comprises a thin film transistor configured to apply the power to the plurality of light emitting regions.

4. The micro LED display of claim 3, wherein the drive element comprises an n-MOS low-temperature polycrystalline silicon (LPTS) thin film transistor.

5. The micro LED display of claim 2, further comprising: a current blocking layer in a region corresponding to the isolation structure on the light emitting layer.

6. The micro LED display of claim 1, wherein the color conversion layer further comprises a partition wall provided between the plurality of color conversion regions.

7. The micro LED display of claim 1,
    wherein the first electrode is provided between the bonding layer and the first semiconductor layer,
    wherein the second electrode is a pixel electrode and provided between the second semiconductor layer and the drive layer, and
    wherein a unit pixel includes two or more light emitting regions.

8. The micro LED display of claim 7,
    wherein the unit pixel comprises a first light emitting region, a second light emitting region, and a third light emitting region of the light emitting layer, and
    wherein the plurality of color conversion regions comprise:
    a first color conversion region for converting a light generated in the first light emitting region into a first color light;
    a second color conversion region for converting a light generated in the second light emitting region into a second color light; and
    a third color conversion region for converting a light generated in the third light emitting region into a third color light.

9. The micro LED display of claim 7,
    wherein the unit pixel comprises a first light emitting region, a second light emitting region, and a third light emitting region of the light emitting layer, and
    wherein the plurality of color conversion regions comprise:
    a first color conversion region for converting a light generated in the first light emitting region into a first color light;
    a second color conversion region for converting a light generated in the second light emitting region into a second color light; and
    a transparent region via which a light generated in the third light emitting region passes without color conversion.

10. A method of manufacturing a micro light emitting diode (LED) display, the method comprising:
    forming a stacked structure including a first semiconductor layer, an active layer, and a second semiconductor layer of a light emitting layer on a growth substrate in an order of the second semiconductor layer, the active layer, and the first semiconductor layer;
    forming an isolation structure in the stacked structure to form a plurality of light emitting regions each corresponding the a pixel in the light emitting layer;
    forming a first electrode on the stacked structure;
    bonding a support substrate to the growth substrate, the support substrate facing the first electrode;
    removing the growth substrate and performing etching to remove a part of a thickness of the second semiconductor layer and expose an end portion of the isolation structure;
    forming a second electrode electrically connected to the stacked structure and configured to generate a light in the plurality of light emitting regions;
    forming a drive layer including a drive element, the drive element being electrically connected to the second electrode on the light emitting layer and configured to apply power to the plurality of light emitting regions; and forming a color conversion layer on the drive layer, the color conversion layer including a plurality of color conversion regions for converting a light emitted from the light emitting layer into light colors.

11. The method of manufacturing the micro LED display of claim 10, further comprising, prior to forming the second electrode, forming a current blocking layer on a region corresponding to the isolation structure,
wherein the second electrode is electrically connected to an upper surface of the stacked structure on which the current blocking layer is formed, corresponding to each light emitting region.

12. The method of manufacturing the micro LED display of claim 10, wherein the isolation structure is formed to a partial thickness of the second semiconductor layer, and
wherein the etching is performed until at least the end portion of the isolation structure is exposed by removing the partial thickness of the second semiconductor layer.

13. The method of manufacturing the micro LED display of claim 12, wherein the isolation structure is formed by injecting ions.

14. The method of manufacturing the micro LED display of claim 10, wherein the color conversion layer is formed to further include a partition wall between the plurality of color conversion regions.

15. The method of manufacturing the micro LED display of claim 10, wherein the first electrode is a common electrode, and the second electrode is a pixel electrode, and
wherein a unit pixel includes two or more light emitting regions.

16. The method of manufacturing the micro LED display of claim 15, wherein the unit pixel comprises a first light emitting region, a second light emitting region, and a third light emitting region of the light emitting layer, and
wherein the plurality of color conversion regions comprise:
a first color conversion region for converting a light generated in the first light emitting region into a first color light;
a second color conversion region for converting a light generated in the second light emitting region into a second color light; and
a third color conversion region for converting a light generated in the third light emitting region into a third color light.

17. The method of manufacturing the micro LED display of claim 15,
wherein the unit pixel comprises a first light emitting region, a second light emitting region, and a third light emitting region of the light emitting layer, and
wherein the plurality of color conversion regions comprise:
a first color conversion region for converting a light generated in the first light emitting region into a first color light;
a second color conversion region for converting a light generated in the second light emitting region into a second color light; and
a transparent region via which a light generated in the third light emitting region passes without color conversion.

18. The method of manufacturing the micro LED display of claim 10, wherein the drive element of the drive layer comprises an n-MOS low-temperature polycrystalline silicon (LPTS) thin film transistor configured to apply the power to the plurality of light emitting regions.

19. A micro light emitting diode (LED) display, comprising:
a support substrate;
a light emitting layer provided on the support substrate, the light emitting layer comprising:
a stacked structure including a first semiconductor layer, an active layer, and a second semiconductor layer;
a first electrode and a second electrode provided on a first side and a second side of the stacked structure, respectively; and
a plurality of light emitting regions each corresponding the a pixel;
a bonding layer between the support substrate and the light emitting layer;
a drive layer provided on the light emitting layer and comprising a drive element, the drive element being electrically connected to the light emitting layer and configured to apply power to the plurality of light emitting regions of the light emitting layer; and
a color filter disposed on the drive layer for color implement,
wherein the support substrate is a separate substrate from a growth substrate on which the stacked structure of the light emitting layer is formed through a semiconductor deposition process, and the bonding layer is formed between the support substrate and the light emitting layer by bonding the support substrate to the growth substrate.

20. The micro LED display of claim 19, wherein the light emitting layer further comprises an isolation structure that separates the plurality of light emitting regions from each other; and,
a current blocking layer in a region corresponding to the isolation structure on the light emitting layer.

* * * * *